United States Patent
Miya et al.

(10) Patent No.: US 7,767,594 B2
(45) Date of Patent: Aug. 3, 2010

(54) SEMICONDUCTOR DEVICE PRODUCING METHOD

(75) Inventors: Hironobu Miya, Toyama (JP); Masayuki Asai, Toyam (JP); Norikazu Mizuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 11/990,451

(22) PCT Filed: Jan. 17, 2007

(86) PCT No.: PCT/JP2007/050571
§ 371 (c)(1), (2), (4) Date: Aug. 14, 2008

(87) PCT Pub. No.: WO2007/083651
PCT Pub. Date: Jul. 26, 2007

(65) Prior Publication Data
US 2009/0104792 A1 Apr. 23, 2009

(30) Foreign Application Priority Data
Jan. 17, 2006 (JP) .............................. 2006-008611

(51) Int. Cl.
*H01L 21/00* (2006.01)
(52) U.S. Cl. .................. 438/787; 257/E21.24
(58) Field of Classification Search .................. 438/787, 438/788, 789, 790, 758
See application file for complete search history.

(56) References Cited

U.S. PATENT DOCUMENTS

| 6,905,939 B2 * | 6/2005 | Yuan et al. .................. 438/424 |
| 2004/0132272 A1 | 7/2004 | Ku et al. |
| 2005/0110101 A1 | 5/2005 | Kaneko et al. |
| 2006/0032442 A1 | 2/2006 | Hasebe |

FOREIGN PATENT DOCUMENTS

| JP | 2004-111962 A | 4/2004 |
| JP | 2005-079223 A | 3/2005 |
| JP | 2005-327836 A | 11/2005 |
| JP | 2006-054432 A | 2/2006 |
| KR | 2004-0025479 A | 3/2004 |
| KR | 10-2006-0050163 A | 5/2006 |

* cited by examiner

*Primary Examiner*—Walter L Lindsay, Jr.
*Assistant Examiner*—Reema Patel
(74) *Attorney, Agent, or Firm*—Birch, Stewart, Kolasch & Birch, LLP

(57) ABSTRACT

Disclosed is a producing method of a semiconductor device, including: loading at least one substrate formed on a surface thereof with a tungsten film into a processing chamber; and forming a silicon oxide film on the surface of the substrate which includes the tungsten film by alternately repeating following steps a plurality of times: supplying the processing chamber with a first reaction material including a silicon atom while heating the substrate at 400° C.; and supplying the processing chamber with hydrogen and water which is a second reaction material while heating the substrate at 400° C. at a ratio of the water with respect to the hydrogen of $2 \times 10^{-1}$ or lower.

15 Claims, 11 Drawing Sheets

SEMICONDUCTOR DEVICE PRODUCING METHOD

This Nonprovisional application claims priority under 35 U.S.C. §119(a) on Patent Application No(s). 2006/008611 filed in Japan on Jan. 17, 2006, the entire contents of which are hereby incorporated by reference.

The present invention relates to a producing method of a semiconductor device, and for example, to a technique which is effective when an oxide film is formed on a semiconductor wafer which is one example of a substrate to be processed by an ALD (Atomic Layer Deposition) method or a CVD (Chemical vapor deposition) method in a producing method of a semiconductor integrated circuit. Especially, the present invention provides a producing method of a semiconductor device for forming an oxide film on a substrate formed with a foundation metal film such as W (tungsten) while preventing the metal film from being oxidized.

In recent years, with density growth and multilayer wiring tendency in semiconductor devices, it is required to form an oxide film on a foundation metal film at a low temperature, and an oxide film material which satisfies such a requirement is also required.

As a CVD oxide film forming method which satisfies the above requirement, a film forming (680 to 700° C.) using thermal decomposition of tetraethoxysilane (TEOS: $Si(OC_2H_5)_4$) has mainly been used. But this method needs to further low the temperature to prevent impurities from being again dispersed, and as an alternate method thereof, an oxide film forming method (580 to 600° C.) using a combination of $O_2$ and bister-challis-butylaminosilane is also used.

As an oxide film forming method (400 to 500° C.) capable of forming an oxide film at a lower temperature, there are an oxide film forming method using a combination of $O_2$ and a material such as triethoxysilane ($HSi(OC_2H_5)_3$) and bismethylsililethane ($H_2Si(CH_3)CH_2CH_2Si(CH_3)H_2$), and an oxide film forming method using a combination of ozone ($O_3$) and trisdimethylaminosilane (TDMAS:$SiH[N(CH_3)_2]_3$).

Recently, however, a metal film made of W and the like is frequently used as an electrode material, and if a metal film is used using the above-described oxide film material, there is a problem that the metal film is oxidized.

It is, therefore, a main object of the present invention to provide a producing method of a semiconductor device capable of forming an oxide film on a metal film at a low temperature while preventing a metal film such as W from being oxidized.

According to one aspect of the present invention, there is provided a producing method of a semiconductor device, comprising:

loading at least one substrate formed on a surface thereof with a tungsten film into a processing chamber; and forming a silicon oxide film on the surface of the substrate which includes the tungsten film by alternately repeating following steps a plurality of times: supplying the processing chamber with a first reaction material including a silicon atom while heating the substrate at 400° C.; and supplying the processing chamber with hydrogen and water which is a second reaction material while heating the substrate at 400° C. at a ratio of the water with respect to the hydrogen of $2\times10^{-1}$ or lower.

According to another aspect of the present invention, there is provided a producing method of a semiconductor device, comprising at least:

loading at least one substrate formed on a surface thereof with a metal film into a processing chamber; and forming an oxide film including silicon on the surface of the substrate which includes the metal film, wherein the forming the oxide film includes:

supplying a first reaction material including a silicon atom into the processing chamber while heating the substrate at a predetermined temperature; and supplying hydrogen and a second reaction material including an oxygen atom into the processing chamber while heating the substrate at the predetermined temperature.

Figure 1:
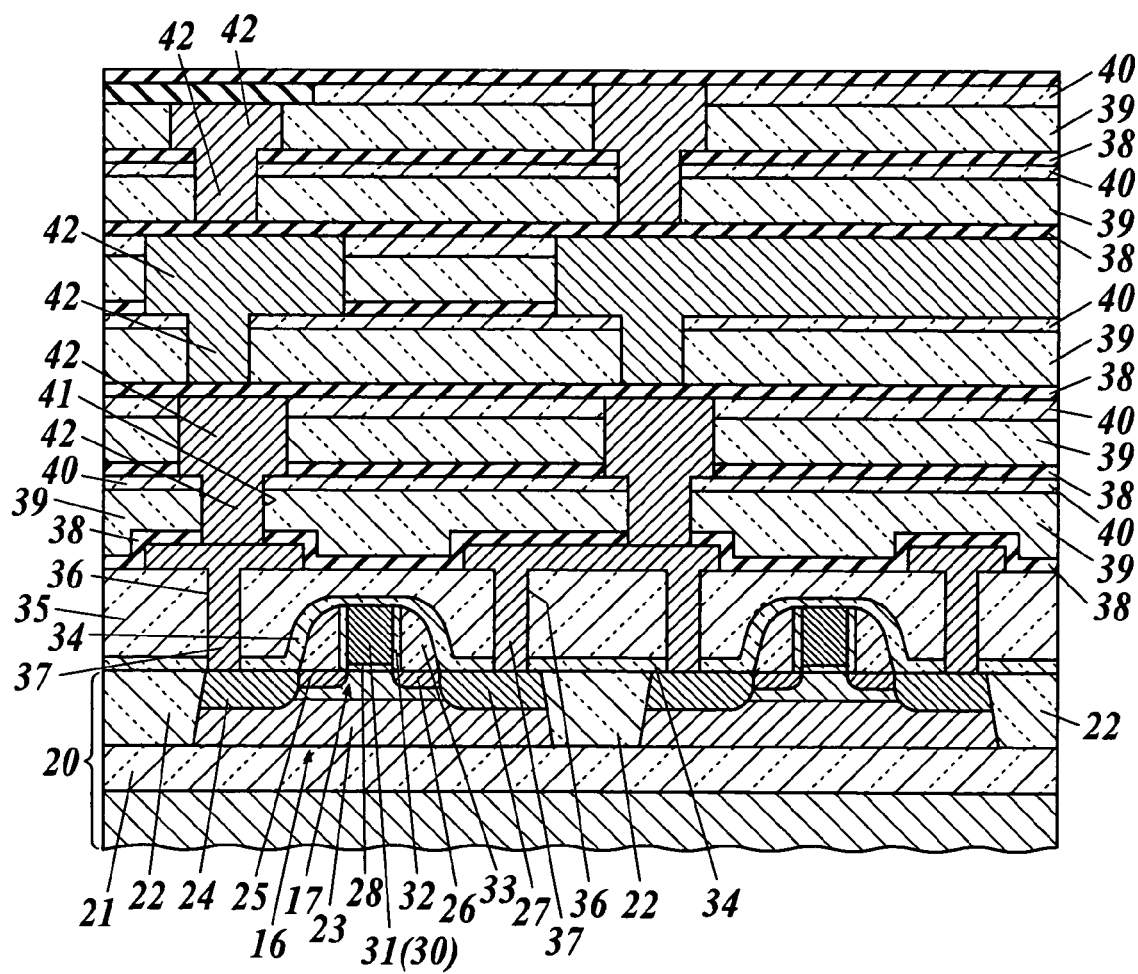
FIG. 1 is a sectional view showing a schematic configuration of a semiconductor device according to preferred embodiments of the present invention.

Preferred embodiments of the present invention will be explained below with reference to the drawings.

Embodiment 1

First, an outline of the preferred embodiments of the present invention will be explained.

The present embodiments relate to a technique for forming an oxide film including silicon on a surface of a substrate including a metal film. In the following description, a case in which a W (tungsten) film is used as one example of the metal film, and a Si oxide film is formed on the W film as one example of an oxide film including silicon will be explained.

Concerning oxidization of the W film when $H_2O$ (water) is used as one example of oxidizing material (oxidizer), it is conceived that the oxidation reaction proceeds by formation and separation of W oxide such as $WO_3H_2O$ and $WO_3$ by W and $H_2O$ (equations (1) and (2)). Especially, since W is consumed and the W film is reduced by phenomenon of the equation (1), if an SiO film is formed thereon, the pattern performance is deteriorated.

In the reaction between W and $H_2O$, activation energy when $WO_2$ is formed is 5.9 eV, activation energy when $WO_3$ is formed is 4.7 eV, and activation energy when $WO_3H_2O$ is formed is 1.2 eV. Therefore, the equation (1) becomes a main reaction between W and $H_2O$.

A reaction equilibrium constant of the equation (1) can be expressed by the equation (3). If the equation (3) is rewritten, the equation (3) becomes the equation (4).

$$K = (P_{WO3H2O})(P_{H2})^3/(P_{H2O})^4 \tag{3}$$

$$P_{WO3H2O} = (P_{H2O})^4/(P_{H2})^3 \exp(-\Delta G/kT) \tag{4}$$

In order to reduce oxidation of W from the equation (4), it is necessary to reduce the partial pressure of $H_2O$, to increase the partial pressure of $H_2$ and to lower the film forming temperature.

Concerning oxidation of W film when $O_3$ (ozone) is used as another example of the oxidizing material, it is conceived that W and $O_3$ form W oxide by reactions as shown in the following equations (5) to (8). Here, $O_3$ is decomposed into $O_2$ and active oxygen radical (O*) by heating as shown in the equation (5), and the active oxygen radical is adsorbed on a W surface to produce $WO_3$ as shown in the equation (6).

$$O_3 = O_2 + O^* \tag{5}$$

$$W + 3O^* = WO_3 \tag{6}$$

If $H_2$ is supplied to W and active oxygen radical, the active oxygen radical and $H_2$ produce $H_2O$ as shown in the equation (7), and W and $H_2O$ produce W oxide as shown in the equation (8). As a result, if $H_2$ is supplied to W and active oxygen radical, the equation (8) that is the same as the equation (1) is derived.

$$W + O^* + H_2 = W + H_2O \tag{7}$$

$$W + 4H_2O = WO_3[H_2O](gas) + 3H_2 \tag{8}$$

Usually, since $H_2$ concentration is greater than $O_3$ concentration, $H_2O$ concentration produced in the equation (7) depends on $O_3$ concentration.

The reaction equilibrium constant in the equation (8) is expressed by the equation (9) that is the same as the equation (3). If the equation (9) is rewritten, the equation (9) becomes the equation (10) that is the same as the equation (4).

$$K = (P_{WO3H2O})(P_{H2})^3/(P_{H2O})^4 \tag{9}$$

$$P_{WO3H2O} = (P_{H2O})^4/(P_{H2})^3 \exp(-\Delta G/kT) \tag{10}$$

When $O_3$ is used as the oxidizing material, like the case where $H_2O$ is used, in order to reduce oxidation of W from the equation (10), it is necessary to reduce the partial pressure of $H_2O$, to increase the partial pressure of $H_2$ and to lower the film forming temperature.

From the equations (4) and (10), when a partial pressure of $H_2O$ is increased while setting a partial pressure of $H_2$ to be constant, the oxidation amount of W is increased. On the contrary, when the partial pressure of $H_2$ is increased while setting the partial pressure of $H_2O$ to be constant, the oxidation amount of W is reduced. Thus, the oxidation amount of W depends on partial pressures of $H_2O$ (or $O_3$) and $H_2$.

In the preferred embodiments of the present invention, when alternately supplying a Si material and an oxidizing material such as $H_2O$ (or $O_3$) onto W, in order to prevent W from being oxidized by $H_2O$ (or $O_3$), $H_2$ is supplied as the same time as $H_2O$ (or $O_3$) is supplied to reduce the partial pressure of $H_2O$. This makes it possible to oxidize the Si material by $H_2O$ (or $O_3$) while preventing W from being oxidized.

Since a partial pressure ratio of $H_2O$ (or $O_3$) to $H_2$ is substantially the same as a supply ratio thereof, it may be conceived that the "partial pressure ratio" and a "supply ratio" are the same.

Next, a semiconductor device according to the preferred embodiments of the present invention will be explained with reference to FIG. 1.

FIG. 1 is a sectional view showing a schematic configuration of the semiconductor device according to the preferred embodiments of the present invention, and more particularly shows one example of the semiconductor device which is a tip device in which MPU/ASIC metal half pitch is more than 65 nm, and which forms a Si oxide film by an ALD method.

A semiconductor device 15 includes a Si substrate 20, and a $SiO_2$ layer 21 is embedded in a surface area of the Si substrate 20. A $SiO_2$ region 22 for separating devices is formed on a Si layer 23 on the $SiO_2$ layer 21, and a plurality of device regions 16 are formed between the $SiO_2$ regions 22. Each device region 16 is formed with source regions 24 and 25 and drain regions 27 and 26. A gate oxide film 28 is formed on a surface of the Si layer 23 between the source region 25 and the drain region 26.

A gate electrode 31 is formed on the gate oxide film 28. The gate electrode 31 comprises a W film 30. An SiO film 32 and an SiN film 33 as sidewalls are formed in this order on a side surface of the gate electrode 31. The source region 25 of low concentration and the drain region 26 of low concentration are formed on the gate electrode 31 in a self-aligning manner. The source region 24 of high concentration and the drain region 27 of high concentration are formed on the SiO film 32 and the SiN film 33 in the self-aligning manner. In the semiconductor device 15, the MOS transistor 17 having the gate oxide film 28, the gate electrode 31, the source regions 24 and 25 and the drain regions 27 and 26 is formed in each device region 16.

When polycide (WSix/PolySi) in which oxidation does not cause a problem is used as constituent material of the gate electrode 31, the SiO film 32 and the SiN film 33 as sidewalls are formed by the CVD method at 680° C. and 700° C., respectively, but since PolySi electrode deteriorates the driving force due to depletion, a metal gate (W film 30) is used as the gate electrode as described above in the generation after MPU/ASIC metal half pitch 65 nm such as the semiconductor device 15.

If the SiN film 33 is formed directly on the side surface of the gate electrode 31, junction capacitance is generated. Therefore, it is general to insulate the side surface of the gate electrode 31 by the SiO film 32 as the device structure becomes smaller in size like the semiconductor device 15 of the embodiment. Further, in order to reduce the junction capacitance or leak current, there is a tendency that insulation material such as SOI (Silicon On Insulator) is used for a lower layer of the Si substrate 20.

An SiN layer 34 which becomes an etching stopper is formed on the entire surface of a surface of the Si substrate 20 formed with the MOS transistor 17. An $SiO_2$ film 35 which becomes an interlayer isolation film is formed on the SiN layer 34. The SiN layer 34 and the $SiO_2$ film 35 are formed with a via hole 36 through which the source region 24 and the drain region 27 of the MOS transistor 17 are exposed. Wiring metals 37 extends through the via holes 36 at portions from the source region 24 and the drain region 27 to an upper surface of the $SiO_2$ film 35.

SiN layers 38 are formed on the entire surface of an upper surface of the $SiO_2$ film 35 such as to cover the wiring metal 37 exposed from the $SiO_2$ film 35. A porous layer 39 having a low dielectric constant is formed on the SiN layer 38, and an SiO₂ layer 40 is provided on the porous layer 39. An interlayer isolation film comprising the porous layer 39 and the SiO₂ layer 40 is formed with a via hole 41. A wiring metal 42 is embedded in the via hole 41. Thereafter, a plurality of interlayer isolation films each comprising the porous layer 39 and the SiO₂ layer 40 are laminated on one another through the SiN layers 38, and the wiring metal 42 penetrates each layer.

According to the semiconductor device 15, the SiO film 32 and the SiN film 33 are sequentially formed after the W film 30 is formed, but if the W film 30 is oxidized when forming the SiO film 32, there arises a problem that a shape thereof is varied due to volume expansion caused by the oxidation of W. Therefore, in the preferred embodiments of the present invention, the SiO film 32 is formed on the W film 30 by the ALD method while preventing the W film 30 from being oxidized.

Next, a selective oxidizing device which is reviewed for realizing the preferred embodiments of the present invention will be explained with reference to FIG. 2.

Figure 2:
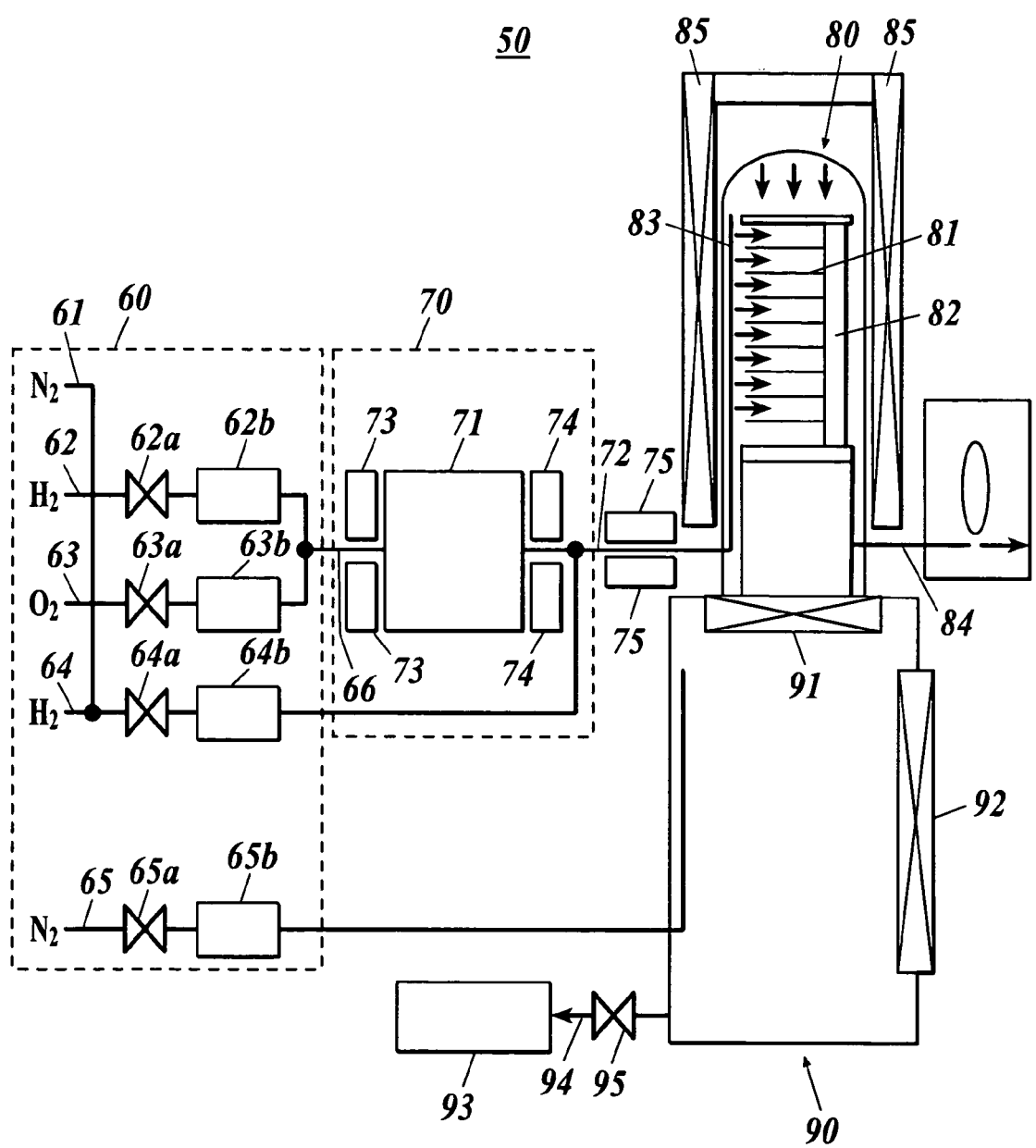
FIG. 2 is a diagram showing a schematic configuration of a selective oxidizing device according to the preferred embodiments of the present invention.

FIG. 2 is a diagram showing a schematic configuration of the selective oxidizing device according to the preferred embodiments of the present invention, and shows a schematic configuration for selectively oxidizing Si while preventing W from being oxidized in a semiconductor device where Si and W exist on a wafer surface at the same time.

The selective oxidizing device 50 mainly includes a gas supply mechanism 60, a catalyst type moisture generating device (CWVG) 70, a processing furnace 80 and a load lock chamber 90. The gas supply mechanism 60 is provided with gas supply pipes 61 to 65 for N2, H₂ and O₂. The supply pipes 62 to 65 are provided with valves 62a to 65a and mass flow controllers 62b to 65b, respectively, so that it is possible to supply gases, stop the supply and adjust the flow rate by opening and closing the valves 62a to 65a, and by controlling the mass flow controllers 62b to 65b. The supply pipe 61 for N2 is connected to the supply pipes 62 to 64 so that gases in the supply pipes 62 to 64 can be purged.

The CWVG 70 includes a reactor 71 which produces H₂O from H₂ and O₂ by a catalyst. The supply pipe 62 for H₂ and the supply pipe 63 for O₂ are connected to each other to form a supply pipe 66, and the supply pipe 66 is connected to one side of the reactor 71. A supply pipe 73 for supplying H₂O produced by the reactor 71 to the processing furnace 80 is connected to the other side of the reactor 71. Heaters 73 to 75 are provided at intermediate portions of the supply pipe 66 and the supply pipe 73 so that gases flowing through the supply pipe 66 and the supply pipe 73 can be heated. The supply pipe 64 for H₂ is connected to the supply pipe 73.

The processing furnace 80 constitutes a processing chamber in which wafers are processed. A boat 82 on which a large number of wafers 81 are placed is accommodated in the processing furnace 80. A nozzle 83 extending along a sidewall is provided inside the processing furnace 80. The nozzle 83 is connected to the supply pipe 73, the nozzle 83 receives gas supply from the supply pipe 73, and the gas is supplied into the processing furnace 80. A discharge pipe 84 is connected to the processing furnace 80 so that unnecessary excessive gas in the processing furnace 80 can be exhausted. The heater 85 is provided outside the processing furnace 80 so that inside of the processing furnace 80 can be heated.

The load lock chamber 90 is provided below the processing furnace 80. A gate valve 91 is provided at an upper portion in the load lock chamber 90, and the boat 82 can be vertically moved between the processing furnace 80 and the load lock chamber 90 through a gate valve 91. A gate valve 92 is provided also on the side of the load lock chamber 90, and the boat 82 can be brought into and out from the load lock chamber 90 between inside and outside the load lock chamber 90 through the gate valve 92. The supply pipe 65 for N2 is in communication with the load lock chamber 90 so that inside of the load lock chamber 90 can be brought into N2 atmosphere. A discharge pipe 94 connected to a vacuum pump 93 is connected to the load lock chamber 90. A valve 95 is provided at an intermediate portion of the discharge pipe 94, and if the vacuum pump 93 is operated in a state where the valve 95 is opened, the load lock chamber 90 can be evacuated.

According to the selective oxidizing device 50, H₂ and O₂ can be supplied to the reactor 71 through the supply pipes 62, 63 and 66 to generate H₂O, and H₂ can be supplied to a supply pipe 72 through the supply pipe 64. In a state where H₂O and H₂ are mixed, the mixture is allowed to flow into the processing furnace 80 from the supply pipe 72 through the nozzle 83, H₂O and H₂ are supplied to wafers 81, and Si is selectively oxidized while preventing W from being oxidized.

Next, a principle for forming an oxide film on a W film while preventing the W film from being oxidized will be explained with reference to FIG. 3.

Figure 3:
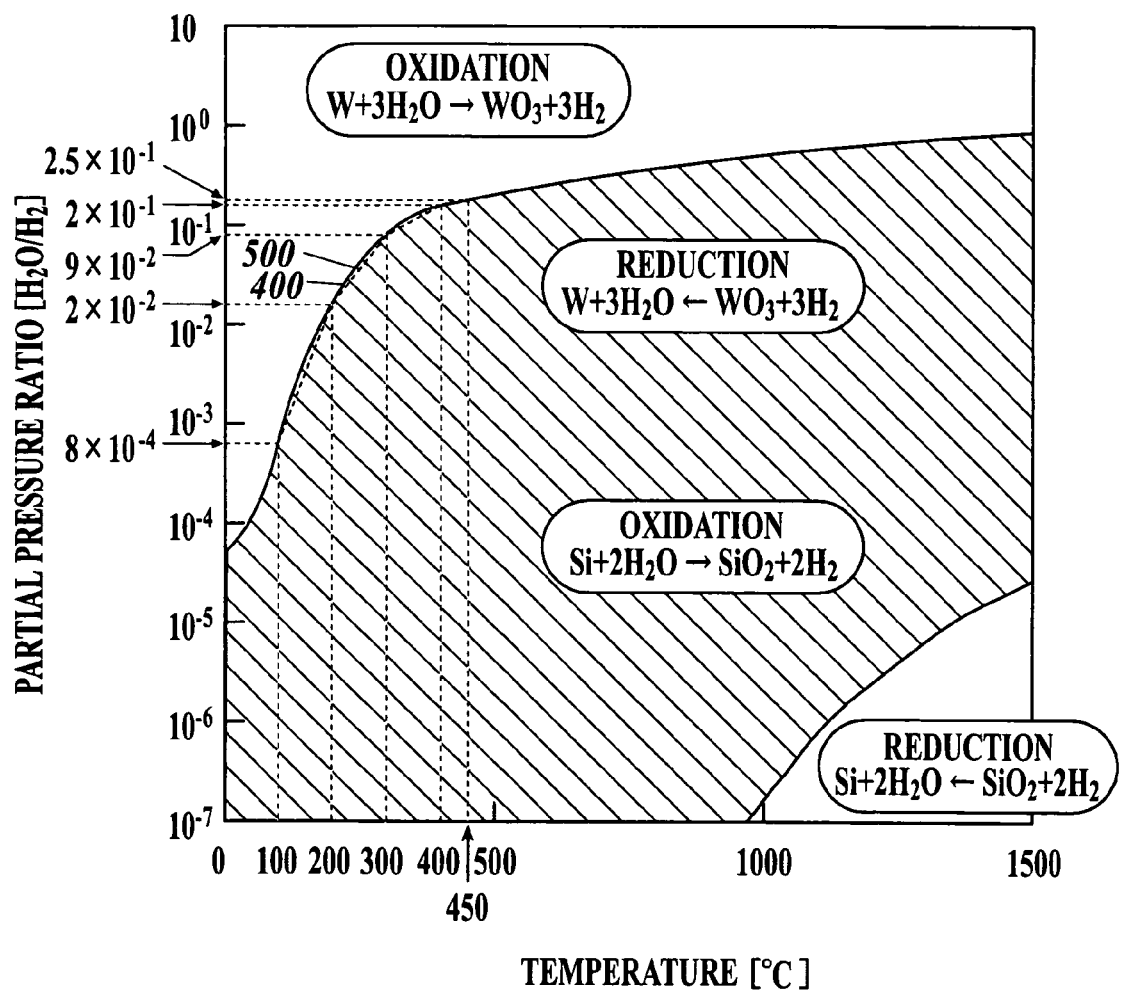
FIG. 3 is a schematic diagram showing an oxidation-reduction region of W and an oxidation-reduction region of Si with respect to a temperature and a partial pressure of $H_2O$ with respect to $H_2$.

FIG. 3 is a schematic diagram showing an oxidation-reduction region of W and an oxidation-reduction region of Si with respect to a temperature and a partial pressure of H₂O with respect to H₂.

When H₂O is used as one example of the oxidizing material, oxidation of W proceeds in a region where the partial pressure of H₂O is high, SiO₂ is reduced in a region where a temperature is high, and reduction of WO₃ and oxidation of Si proceed at the same time in an intermediate region thereof. The oxidation speed of Si is increased together with the partial pressure of H₂O and the thickness of the oxide film is increased.

At temperature in a range of 100 to 450° C., if a partial pressure ratio of H₂O with respect to H₂ is equal to or lower than a curve (a boundary line between oxidation and reduction) shown with a reference number 400 in FIG. 3, it can be found from FIG. 3 that WO₃ is reduced and it is possible to prevent W from being oxidized. More specifically, if a temperature and a partial pressure ratio of H₂O with respect to H₂ are denoted by (T(° C.), H₂O/H₂), (T(° C.), H₂O/H₂)=(100° C., 8×10⁻⁴), (200° C., 2×10⁻²), (300° C., 9×10⁻²), (400° C., 2×10⁻¹) and (450° C., 2.5×10⁻¹). If the partial pressure ratio of H₂O with respect to H₂ at temperature in a range of 100 to 450° C. is equal to or less than straight lines connecting these points (straight lines shown with a reference number 500 in FIG. 3), it can be found that it is possible to reduce WO₃ and to prevent W from being oxidized.

For example, if the temperature is 400° C. and the partial pressure ratio of H₂O with respect to H₂ is equal to or less than 2×10⁻¹, WO₃ is reduced and it is possible to prevent W from being oxidized.

In order to oxidize Si while preventing W from being oxidized, it is necessary that the lower limit value of the temperature is set to 100° C. The reason why the lower limit value is set to 100° C. is that if the value is less than 100° C., the oxidation ability of H₂O with respect to Si is lost or reduced.

When O₃ is used as another example of the oxidizing material, under sufficient H₂ atmosphere, H₂O is produced from O₃ as shown in the equations (11) and (12) at a low temperature of 450° C. or less, and H₂O is produced from O₃ as shown in the equations (13) and (14) also at a low temperature of higher than 450° C. Like the case where H₂O is used as one example of the oxidizing material, reduction of WO₃ and oxidation of Si are expressed with the partial pressure of H₂O.

$$O_3 = O_2 + O^* \tag{11}$$

$$O^* + H_2 = H_2O \tag{12}$$

$$O_3 = 3O^* \tag{13}$$

$$3O^* + 3H_2 = 3H_2O \tag{14}$$

However, when $O_3$ is used as another example of the oxidizing material, 1 mole oxygen radical is produced with respect to 1 mole $O_3$ (see equation (11)) at a low temperature of 450° C. or less, whereas 3 moles oxygen radical is produced with respect to 1 mole $O_3$ at a high temperature of higher than 450° C. (see equation (13)). Thus, the fact that the $H_2O$ concentration is varied between the low temperature range and high temperature range should be taken into account.

When $O_3$ is used as the oxidizing material at a low processing temperature of 450° C. or less, since 1 mole $H_2O$ is produced from 1 mole 03 (thermal decomposition of $O_3$ at 400° C. is 99.9%) based on the equations (11) and (12), even if $O_3$ is used as the oxidizing material, it can be conceived that $O_3$ is equal to $H_2O$ as the oxidizing material, and it can also be conceived that a relation between the temperature and the partial pressure ratio of $O_3$ with respect to $H_2$ is equal to a relation between the temperature and the partial pressure ratio of $H_2O$ with respect to $H_2$.

Next, an ALD oxide film forming device according to the preferred embodiments of the present invention will be explained with reference to FIG. 4.

Figure 4:
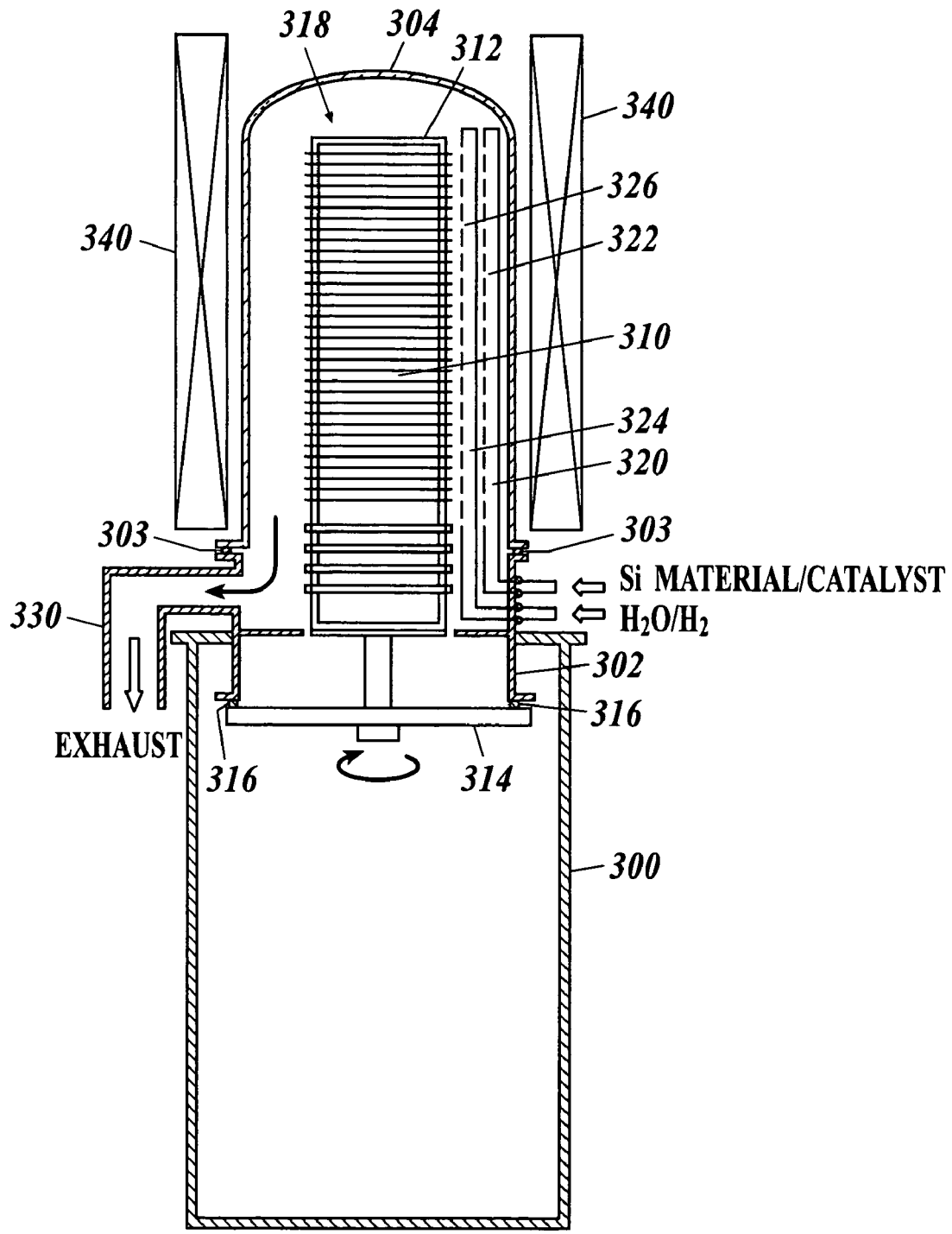
FIG. 4 is a vertical sectional view showing a schematic configuration of an ALD oxide film forming device according to the preferred embodiments of the present invention.

FIG. 4 is a vertical sectional view showing a schematic configuration of the ALD oxide film forming device according to preferred embodiments of the present invention.

The ALD oxide film forming device 202 includes a load lock chamber 300. The load lock chamber 300 is provided at its upper portion with a processing furnace 304 through a manifold 302 and an O-ring 303. The boat 312 on which the plurality of wafers 310 are placed is accommodated in the processing furnace 304, and W films are formed on surfaces of the wafers 310. The boat 312 is rotatably supported by a seal cap 314. The seal cap 314 is in intimate contact with a flange portion of the manifold 302 through the O-ring 316, and a lower portion of the processing furnace 304 is closed. In the ALD oxide film forming device 202, a processing chamber 318 which processes the wafers 310 is formed by at least the seal cap 314, the O-ring 316, the manifold 302, the O-ring 303 and the processing furnace 304.

The processing furnace 304 is provided with nozzles 320 and 324. The nozzles 320 and 322 extend along an inner wall of the processing furnace 304, and a large number of supply holes 322 and 326 are provided at intermediate portions of the nozzles. Si material (e.g., TDMAS) flows into the nozzles 320, and the Si material can be supplied to the processing chamber 318 from the supply hole 322. The oxidizing material (e.g., $H_2O$ or $O_3$) can flow into the nozzle 324, and the oxidizing material can be supplied to the processing chamber 318 from the supply hole 326.

A discharge pipe 330 is connected to the manifold 302 so that gas in the processing furnace 304 can be exhausted. A heater 340 is provided outside the processing furnace 304 so that the processing chamber 318 can be heated.

According to the ALD oxide film forming device 202, basically, a Si material and an oxidizing material such as $H_2O$ are alternately supplied to the processing chamber 318 through the nozzles 320 and 324 repeatedly a plurality of times while heating the processing chamber 318 by the heater 340, and Si oxide films can be formed on the W films of the wafers 310. Especially in this embodiment, when the oxidizing material is supplied through the nozzle 324, $H_2$ is also supplied at the same time, and Si oxide film are formed while preventing the W film from being oxidized.

When $H_2O$ is used as the oxidizing material, if the supply pipe 72 of the selective oxidizing device 50 is connected to the nozzle 324, $H_2O$ and $H_2$ can be supplied to the processing chamber 318 at the same time.

As shown in FIG. 3, when the wafers 310 in the processing chamber 318 are heated at a low temperature of 400° C. by the heater 340, it is necessary that the partial pressure ratio of $H_2O$ with respect to $H_2$ is set to $2 \times 10^{-1}$ or lower to prevent the W film on the wafer 310 from being oxidized.

Further, $O_2$ and $O_3$ can also be used as the oxidizing material in addition to $H_2O$. This is because that if $O_2$ and $O_3$ are supplied together with H2 at the same time, $O_2$ and $O_3$ can react with $H_2$ and $H_2O$ can be produced. When $O_2$ is used as the oxidizing material, it is necessary that the temperature in the processing chamber 318 is increased to at least 500° C. or higher to react with the $H_2$, but if $O_3$ is used as the oxidizing material, it is possible to produce the same at a low temperature (see equations (11) and (12)).

A catalyst such as pyridine (CAS No. 110-86-1, $C_5H_5N$, molecular weight 79.1) may be supplied into the processing chamber 318 together with the Si material from the nozzle 320 to form an Si oxide film, or a catalyst such as pyridine may be supplied into the processing chamber 318 together with the Si material and $H_2O$ to form an Si oxide film.

A device for generating plasma may be used as another example of the ALD oxide film forming device, and $H_2O$ may be generated by $H_2$ and plasma-excited $O_2$.

Figure 5:
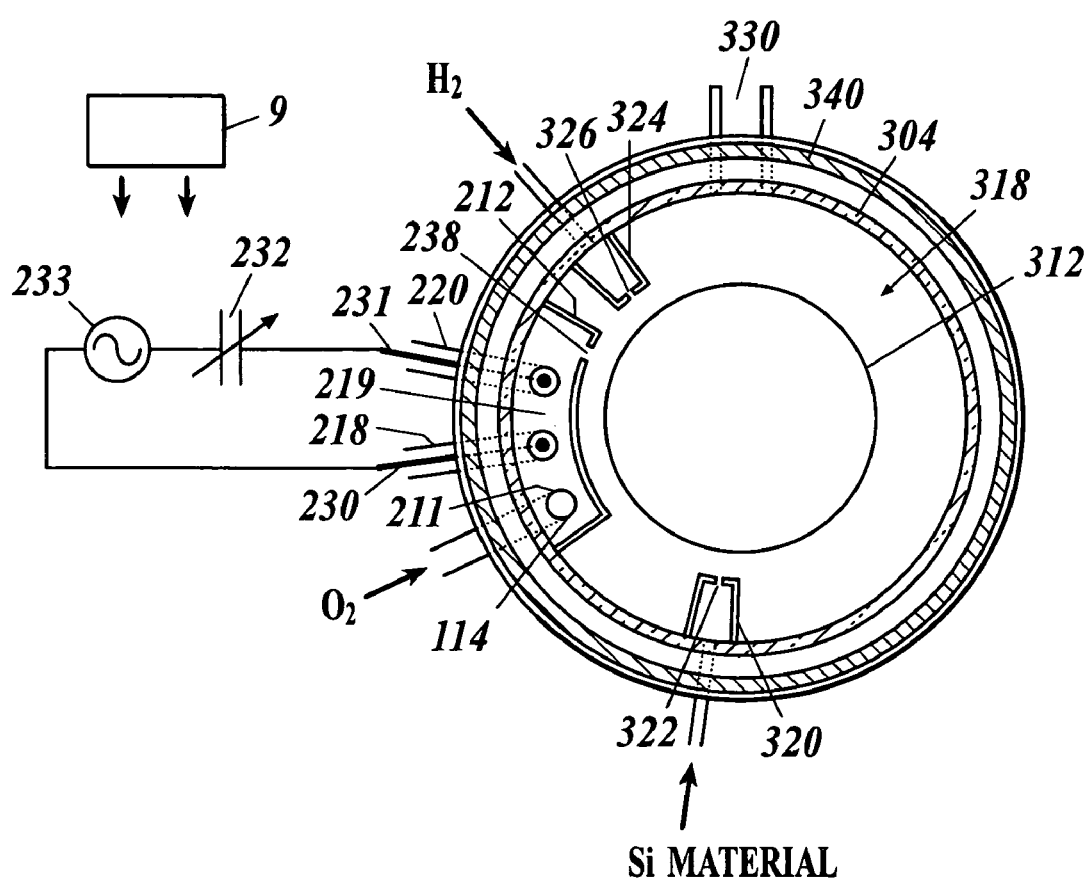
FIG. 5 is a transverse sectional view showing a modification of the ALD oxide film forming device shown in FIG. 4.

One example of the ALD oxide film forming device capable of generating plasma which is a modification of the ALD oxide film forming device shown in FIG. 4 will be shown with reference to FIG. 5.

The processing furnace 304 is provided with a nozzle 114 through which $O_2$ is supplied to the processing chamber 318. The nozzle 114 extends along the inner wall of the processing furnace 304, and a large number of supply holes 211 are formed at an intermediate portion thereof. The processing furnace 304 is provided with a pair of electrodes 230 and 231 and covers 218 and 220 for protecting the electrodes. The electrodes 230 and 231 and the covers 218 and 220 also extend along the inner wall of the processing furnace 304, and the electrodes and 231 are inserted through the covers 218 and 220.

A variable capacitor 232 and an AC power supply 233 are provided between the electrodes 230 and 231. A control device 9 is connected to the variable capacitor 232 and the AC power supply 233.

The processing furnace 304 is provided with a diaphragm 212 such as to surround the nozzle 114, the electrodes 230 and 231 and the covers 218 and 220. The diaphragm 212 stands along the inner wall of the processing furnace 304 to form a supply hole 238 like the nozzle 114.

According to the above-described ALD oxide film forming device 202, if voltage is applied between the electrodes 230 and 231, plasma can be generated in a region surrounded by the diaphragm 212 and the inner wall of the processing furnace 304. In this case, if $O_2$ is supplied to the processing furnace 304 through the nozzle 114, oxidation radical is produced, the oxygen radical is supplied to the processing chamber 318 through the supply hole 238 of the diaphragm 212, and $H_2O$ can be generated in the processing chamber 318.

At the same time when $O_2$ is supplied, inert gas such as Ar and N2 may be supplied to the processing furnace 304.

Next, a forming method of an oxide film according to the preferred embodiments of the present invention using the ALD oxide film forming device will be explained with reference to FIGS. 6 to 9.

A process sequence of the Si oxide film by a normal ALD method will be explained with reference to FIG. 6.

Figure 6:
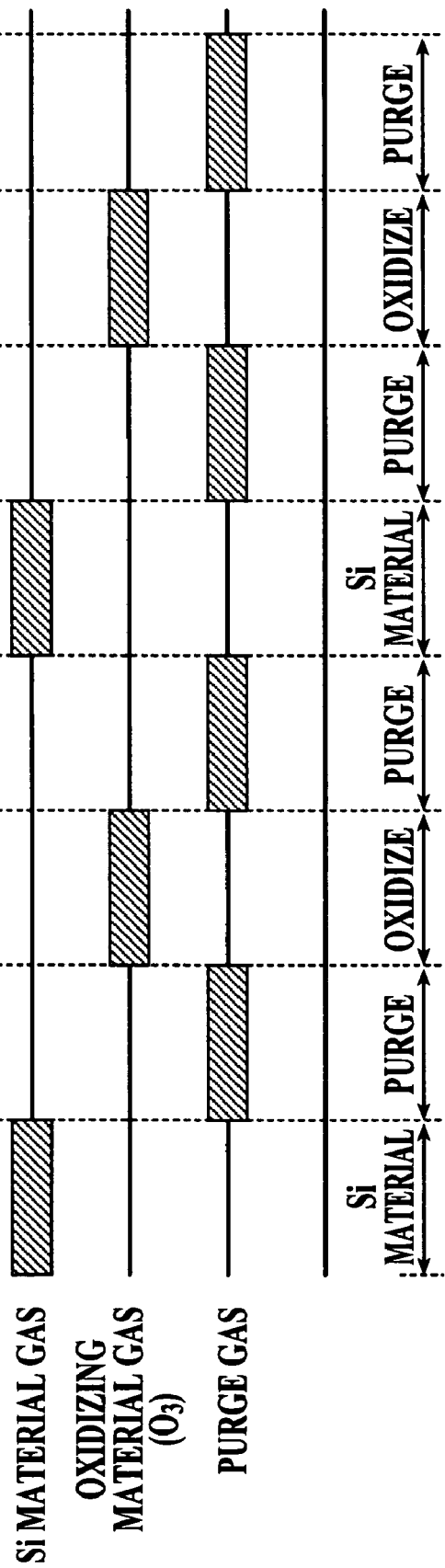
FIG. 6 is a diagram showing a schematic sequence when an oxide film is formed using a normal ALD method.

Before the Si oxide film is formed, a plurality of wafers 310 are brought into the processing chamber 318 from the load lock chamber 300 in a state where the wafers 310 formed with W films are placed on the boat 312, and the processing of cycle shown in FIG. 6 is repeatedly executed. One cycle mainly includes four steps.

In the first step, the wafers 310 in the processing chamber 318 are heated to a predetermined temperature, the Si material is supplied into the processing chamber 318 from the nozzle 320 and the material is adsorbed on the surfaces of the wafers 310.

In the second step, the inside of the processing chamber 318 is purged by inert gas, the Si material remaining in the processing chamber 318 is exhausted from the processing chamber 318 through the discharge pipe 330.

In the third step, the wafers 310 in the processing chamber 318 are heated to substantially the same temperature as that in the first step, the oxidizing material (e.g, $H_2O$ or $O_3$) is supplied into the processing chamber 318 from the nozzle 324, and the Si material adsorbed on the surfaces of the wafers 310 and the oxidizing material are reacted with each other to form Si oxide films.

In the fourth step, the inside of the processing chamber 318 is purged by inert gas, and oxidizing material remaining in the processing chamber 318 is exhausted from the processing chamber 318 through the discharge pipe 330.

The processing time in the first step (Si material supplying step) is 1 to 30 seconds, the processing time in the is the second step (purge step) is 5 to 15 seconds, the processing time in the third step (oxidizing material supplying step) is 5 to 60 seconds, and the processing time in the fourth step (purge step) is 3 seconds.

The processing operations in the first to fourth steps are executed while controlling the timing of supply and discharge of the processing gas (Si material gas, oxidizing material gas), the pressure in the processing chamber 318 and the operation of the heater 340.

In the preferred embodiment of the present invention, the following sequences (A) to (C) are employed.

Figure 7:
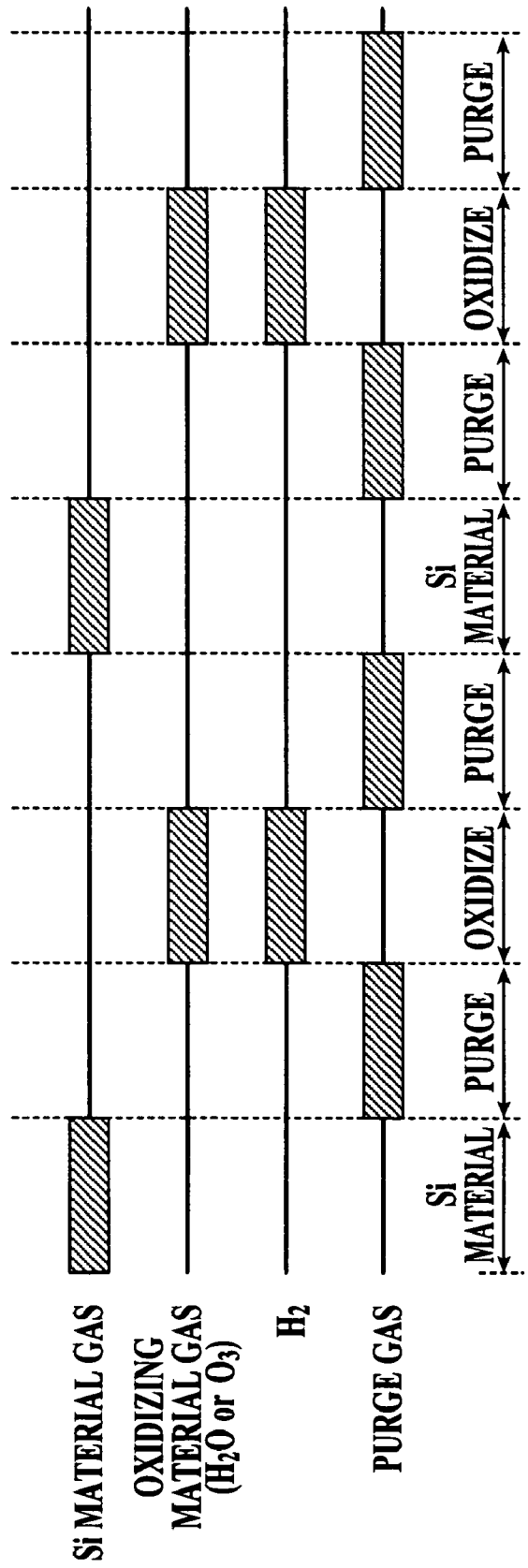
FIG. 7 is a diagram showing a schematic sequence (A) when an oxide film is formed on a W film in the preferred embodiments of the present invention.

Concretely, in the sequences (A), as shown in FIG. 7, the first, second and fourth steps are the same as the ALD oxide film forming step in FIG. 6. In the third step, $H_2$ and the oxidizing material (e.g., $H_2O$ or $O_3$) are supplied into the processing chamber 318 from the nozzle 324 at the same time.

Especially in the sequence (A), in the third step, the heating temperature of the processing chamber 318 and a supply ratio of $H_2O$ are controlled so as to prevent the W films from being oxidized. That is, in FIG. 3, the heating temperature of the processing chamber 318 and the supply ratio of $H_2O$ with respect to $H_2$ are controlled such that a region where $WO_3$ is reduced is selected.

For example, when $H_2O$ is supplied as the oxidizing material while heating the processing chamber 318 at 400° C., the supply ratio of $H_2O$ with respect to $H_2$ is set to $2\times10^{-1}$ or less. When the processing chamber 318 is heated within a range of 100 to 450° C., the supply ratio of $H_2O$ with respect to $H_2$ is set to a curve shown with a symbol 400 in FIG. 3 or less (straight line shown with a symbol 500 in FIG. 3 or less). As a result, even if the W film is oxidized in the sequence (A), the oxide is reduced, the Si material is oxidized even at a low temperature as low as 450° C. or less, and it is possible to form a Si oxide film on the W film at a low temperature as low as 450° C. or less.

Also when $O_3$ is supplied as the oxidizing material while heating the processing chamber 318 at temperature in a range of 100 to 450° C., if the supply ratio of $O_3$ with respect to $H_2$ is handled as the supply ratio of $H_2O$ with respect to $H_2$, it is possible to form an Si oxide film on the W film at a low temperature as low as 450° C. or less while preventing the W film from being oxidized.

Figure 8:
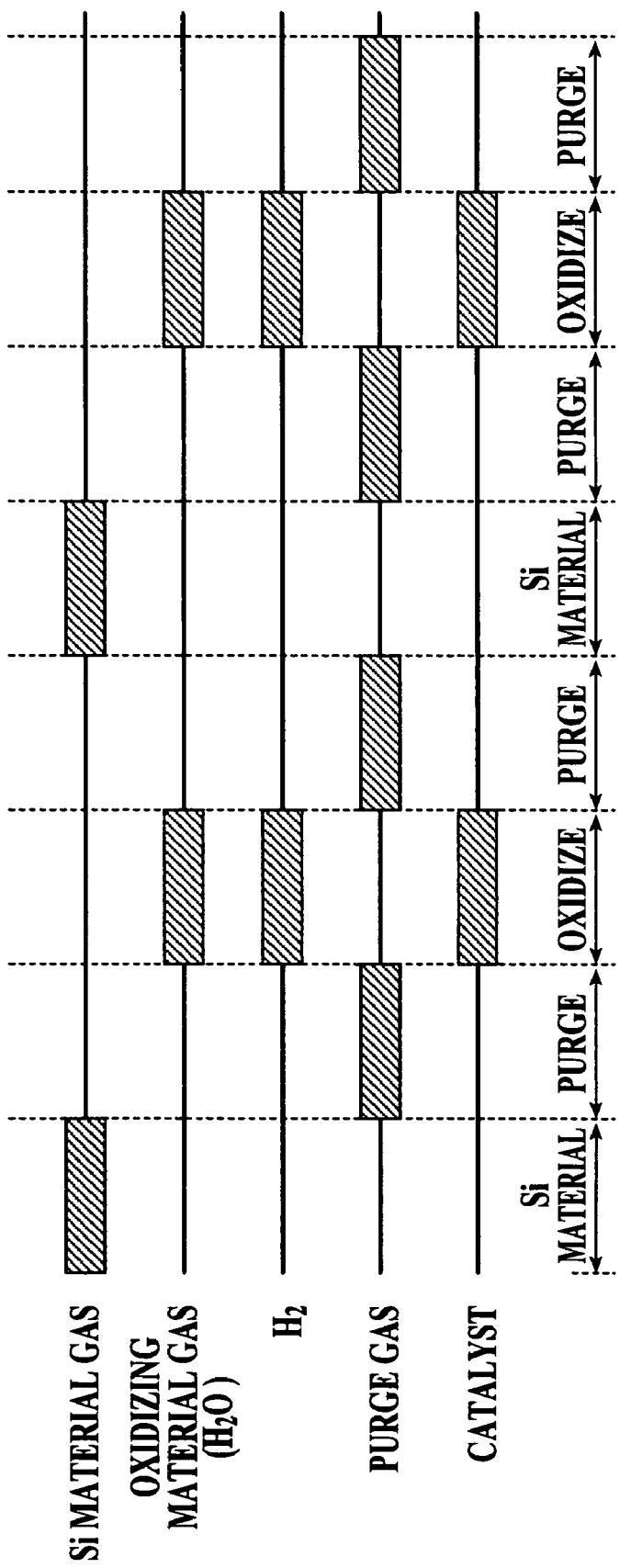
FIG. 8 is a diagram showing a schematic modification of the sequence (A), and shows a sequence (B) when a catalyst is used.
Figure 9:
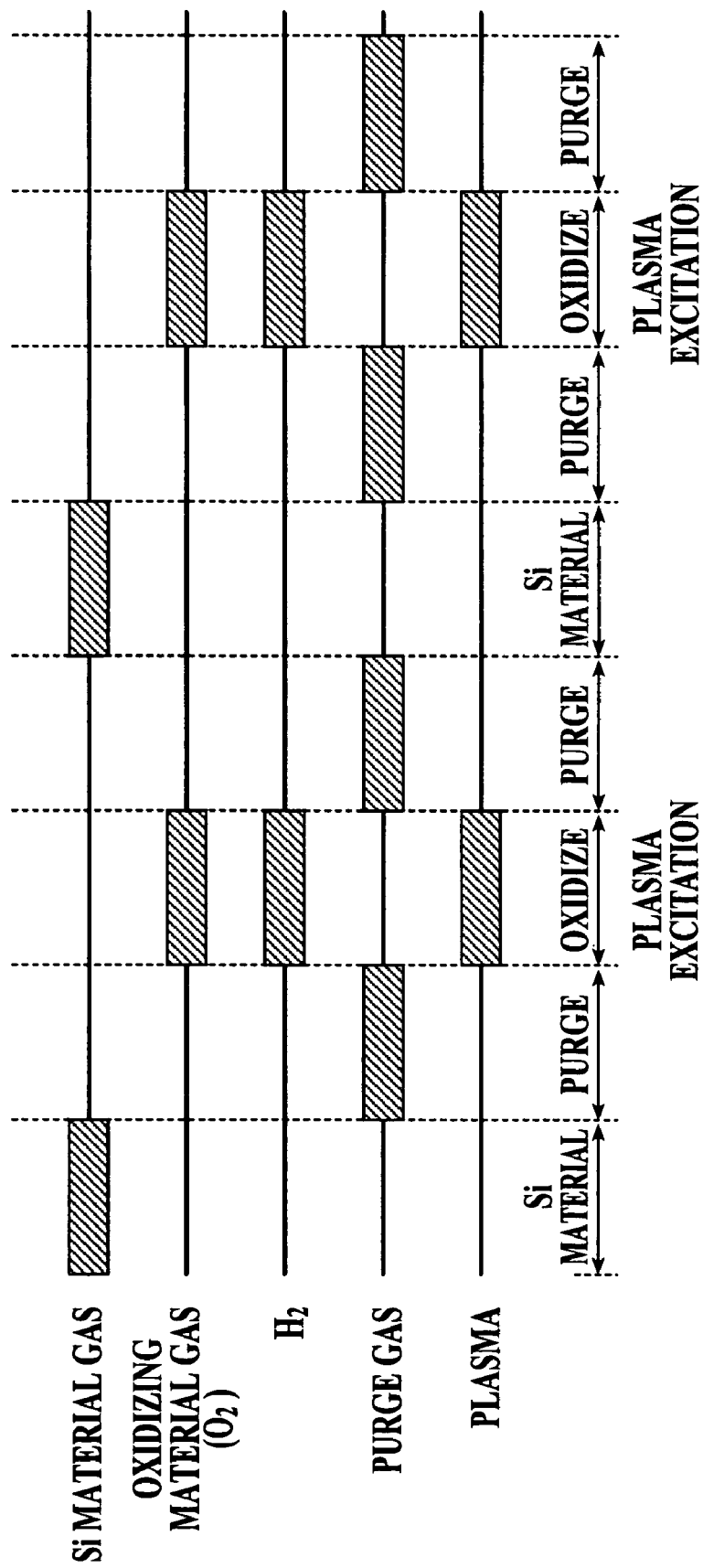
FIG. 9 is a diagram showing a schematic modification of the sequence (A), and shows a sequence (C) when plasma excitation is used.

In the sequence (B) which is a modification of the sequence (A), as shown in FIG. 8, the first to fourth steps are basically the same as the steps in the sequence (A), and especially in the third step, a catalyst is supplied to the processing chamber 318 in addition to the oxidizing material (e.g., $H_2O$) and $H_2$. As the catalyst, a material such as the pyridine can be used. With such a catalyst, it is possible to easily form a Si oxide film at a low temperature as low as 450° C. or less.

In the sequence (B), a catalyst such as the pyridine can be supplied to the processing chamber 318 in addition to the Si material also in the first step.

In the sequence (C) which is a modification of the sequence (A), the first to fourth steps are basically the same as the steps in the sequence (A). Especially, ALD oxide film forming device capable of generating plasma as shown in FIG. 5 is used, $O_2$ is used as an oxidizing material, and plasma-excited $O_2$ and non-excited $H_2$ are supplied into the processing chamber 318 at the same time in the third step.

It is an object of the preferred embodiments of the present invention to form an oxide film at a low temperature while preventing W from being oxidized. Therefore, the oxide film may be formed without supplying $H_2$ after the oxide film is formed until a desired thickness at which W is not oxidized is obtained. In this case, the productivity (film forming speed) of the oxide film can be enhanced.

That is, an oxide film is formed while supplying an oxidizing material and $H_2$ complying with the sequences (A) and (C) until a desired thickness at which it is conceived that W is not oxidized is obtained, and if the thickness reaches a value at which W is not oxidized, $H_2$ is not supplied thereafter, and the film forming manner is switched to the normal ALD method complying with the sequence in FIG. 6. The "normal ALD method" mentioned here is a method in which a Si oxide film is formed while alternately supplying a Si material and an oxidizing material a plurality of times in a state where $H_2$ is not supplied.

A relation between a film thickness of an oxide film formed on W and an oxidizing material which passes through the oxide film and oxidizes W can be obtained by calculating a diffusion constant in oxygen in the oxide film.

In this embodiment, a film thickness $X_0$ at which it is possible to avoid oxidation of W is expressed by the equation (15) complying with a line rule.

$$X_0 = B/A \times t \quad (15)$$

$[B/A] = Ce^{-E_2/kT}$, $[C] = 18.35$ Å/second, $[E_2] = 7.5 \times 10^{-2}$ eV, $[k]$ is a Boltzmann constant and $k = 8.62 \times 10^{-5}$ eVK$^{-1}$, and $[t]$ is supply time (oxidation time) of $O_3$.

For example, when an Si oxide film is to be formed using $O_3$ while heating the processing chamber 318 to 300° C., a value of K is 273+300=573 (K), and a value B/A can be calculated as about 4.01 Å/second. If the supply time of $O_3$ is 5 seconds, a value $X_0$ can be calculated as about 20 Å. Since a film thickness per one layer Si oxide film is about 0.7 Å, if the Si oxide films are laminated by 29 layers, the film thickness of the Si oxide film reaches 20 Å, and it is conceived that oxidation of W by $O_3$ can be avoided.

Therefore, in this case, an Si oxide film is formed by the ALD method in which $O_3$ and $H_2$ are supplied until the Si oxide films are laminated by 29 layers and the film thickness reaches 20 Å, and after the film thickness reaches 20 Å, in the supply step of $O_3$ and $H_2$, $H_2$ is not supplied and the Si oxide film may be formed by the normal ALD method. As a result, the productivity (film forming speed) of Si oxide film can be enhanced.

Next, a substrate processing apparatus according to the preferred embodiments of the present invention will be explained with reference to FIG. 10.

The substrate processing apparatus is constituted as one example of a semiconductor producing apparatus which carries out processing steps in a producing method of a semiconductor device (IC (Integrated Circuit)). A case in which a vertical type apparatus which subjects substrates to oxidation processing will be explained as one example of the substrate processing apparatus in the following description.

Figure 10:
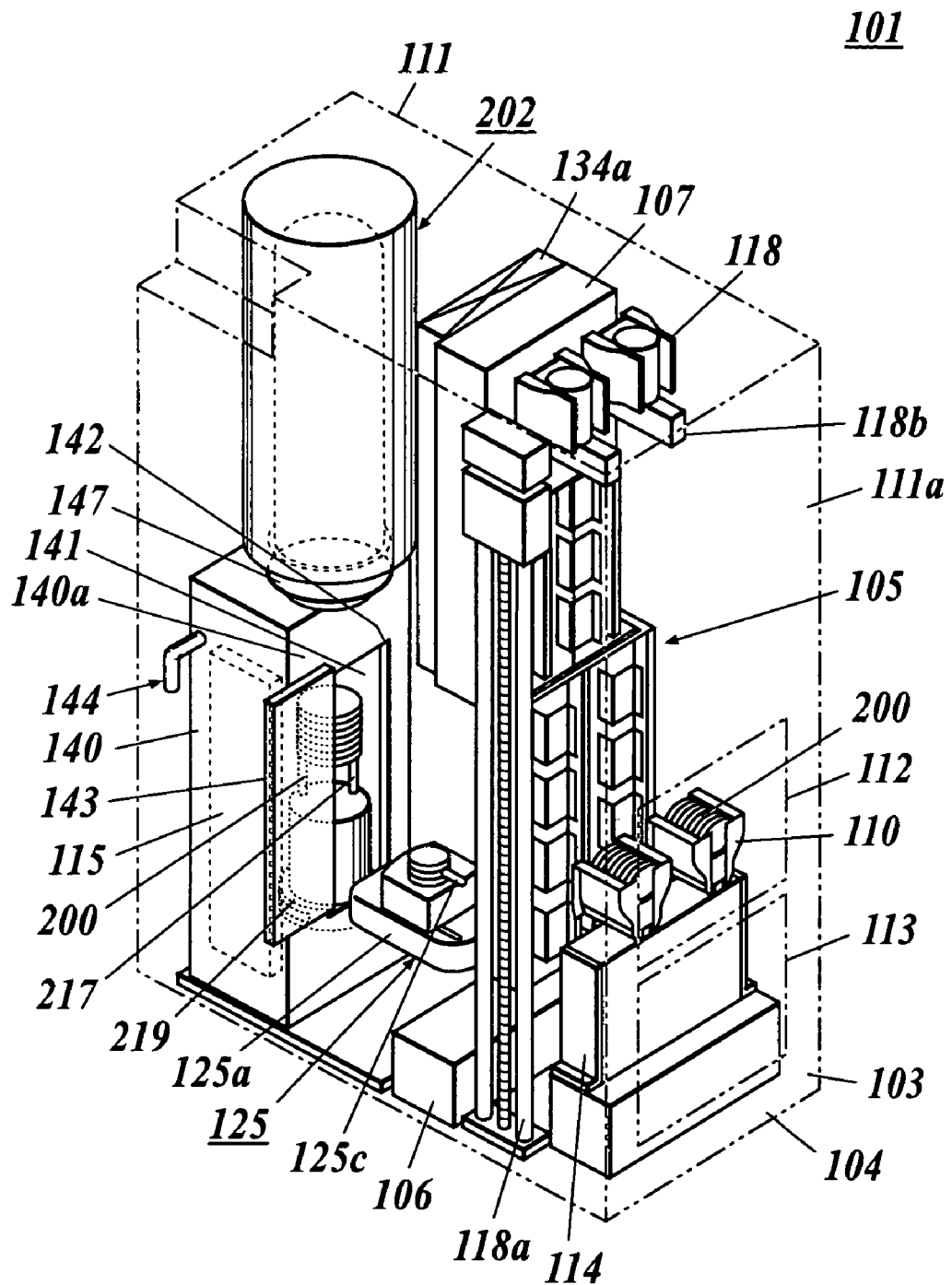
FIG. 10 is a perspective view showing a schematic configuration of a substrate processing apparatus according to the preferred embodiments of the present invention.

FIG. 10 is a perspective view showing a schematic configuration of the substrate processing apparatus according to the preferred embodiments of the present invention.

A processing apparatus 101 uses wafers 200 made of silicon as one example of substrates, and uses cassettes 110 as wafer carriers which accommodate the wafers 200. The processing apparatus 101 includes a casing 111 having a front wall 111a. A front maintenance opening 103 as an opening is formed at a lower portion of the front wall 111a so that maintenance can be carried out. A front maintenance door 104 is provided for opening and closing the front maintenance opening 103.

A cassette carry in/out opening 112 is formed at the maintenance door 104 so that an inside and an outside of the casing 111 are in communication through the cassette carry in/out opening 112. The cassette carry in/out opening 112 is opened and closed by a front shutter 113.

A cassette stage 114 is disposed at the cassette carry in/out opening 112 inside the casing 111. The cassette 110 is transferred onto the cassette stage 114 by a rail guided vehicle (not shown) and carried out from the cassette stage 114. The cassette 110 delivered by the rail guided vehicle is placed on the cassette stage such that the wafers 200 in the cassette 110 are in their vertical attitudes and a wafer in/out opening of the cassette 110 is directed upward.

Cassette shelves 105 are disposed substantially at a central portion in the casing 111 in its longitudinal direction, and the cassette shelves 105 store a plurality of cassettes 110 in a plurality of rows and a plurality of lines. The cassette shelves 105 are provided with transfer shelves 123 in which the cassettes 110 to be transferred by a wafer loading mechanism 125 are to be accommodated. Buffer cassette shelves 107 are provided above the cassette stage 114 to subsidiarily store the cassettes 110.

A cassette transfer device 118 is provided between the cassette stage 114 and the cassette shelves 105. The cassette transfer device 118 includes a cassette elevator 118a capable of vertically moving while holding the cassette 110, and a cassette transfer mechanism 118b as a transfer mechanism. The cassette transfer device 118 transfers the cassette 110 between the cassette stage 114, the cassette shelves 105 and the auxiliary cassette shelves 107 by a continuous motion of the cassette elevator 118a and the cassette transfer mechanism 118b.

A wafer loading mechanism 125 is provided behind the cassette shelves 105. The wafer loading mechanism includes a wafer loading device 125a which can rotate or straightly move the wafer 200 in the horizontal direction, and a wafer loading device elevator (not shown) which vertically moves the wafer loading device 125a. The wafer loading device elevator is provided on a right end of the pressure-proof casing 111. Tweezers 125c of the wafer loading device 125a as a placing portion of the wafers 200 charges a boat 217 with wafers 200 and discharges the wafers 200 from the boat 217 by continuous motion of the wafer loading device elevator and the wafer loading device 125a.

A clean unit 134a for supplying clean air which is a purified atmosphere is provided behind the buffer shelves 107. The clean unit 134a includes a dustproof filter and a supply fan so that the clean air flows into the casing 111.

A clean unit (not shown) for supplying clean air is provided on a right side of the casing 111, i.e. on the opposite side of the wafer loading device elevator. The clean unit includes a supply fan and a dustproof filter as with the clean unit 134a. Clean air supplied from the clean unit flows through near the wafer loading device 125a and the boat 217, and then is exhausted outside the casing 111.

A pressure-proof casing 140 is disposed behind a wafer loading device 125a. The pressure-proof casing 140 has a hermetic structure capable of maintaining a pressure lower than atmospheric pressure (negative pressure). The pressure-proof casing 140 forms a load lock chamber 141 which is a load lock type standby chamber having a capacity capable of accommodating the boat 217.

A wafer transfer in/out opening 142 is formed in a front wall 140a of the pressure-proof casing 140. The wafer transfer in/out opening 142 is opened and closed by a gate valve 143. A gas supply pipe 144 through which an inert gas such as nitrogen gas is supplied to the load lock chamber 141 and a discharge pipe (not shown) through which gas in the load lock chamber 141 is exhausted while keeping a negative pressure in the load lock chamber 141 are connected to a sidewall of the pressure-proof casing 140.

A processing furnace 202 is provided above the load lock chamber 141. A low end of the processing furnace 202 is opened and closed by a furnace opening gate valve 147.

As schematically shown in FIG. 10, a boat elevator 115 for vertically moving the boat 217 is disposed in the load lock chamber 141. An arm (not shown) as a connecting tool is connected to the boat elevator 115. A seal cap 219 as a lid is horizontally connected to the arm. The seal cap 219 vertically supports the boat 217, and the seal cap 219 can close the lower end of the processing furnace 202.

The boat 217 includes a plurality of holding members. In a state where a plurality of (e.g., about 50 to 150) wafers 200 are arranged in the vertical direction such that their centers are aligned with each other, the boat 217 horizontally holds the wafers 200.

Next, the operation of the substrate processing apparatus 101 will be explained.

Before a cassette 110 is supplied to the cassette stage 114, a cassette loading/unloading opening 112 is opened by a front shutter 113. Then, the cassette 110 is loaded into the cassette stage 114 from the cassette transfer in/out opening 112. At that time, the wafers 200 in the cassette 110 are held in their vertical attitudes, and the cassette 110 is disposed such that a wafer in/out opening of the cassette 110 is directed upward.

Next, the cassette 110 is lifted up from the cassette stage 114 by the cassette transfer device 118, the cassette 110 is rotated clockwisely in the vertical direction by 90° such that the wafers 200 in the cassette 110 are in their horizontal attitudes, and the wafer in/out opening of the cassette 110 is directed rearward of the casing 111. Next, the cassette 110 is automatically transferred to a designated shelf position of the cassette shelves 105 or the buffer shelves 107 by the cassette transfer device 118, the cassette 110 is delivered and temporarily stored and then, the cassette 110 is transferred to the cassette shelves 105 by the cassette transfer device 118 or directly transferred to the cassette shelves 105.

Then, a slide stage 106 horizontally moves the cassette shelves 105, and positions the cassette 110 which is to be loaded such that the cassette 110 is opposed to the wafer loading device 125a. The wafer loading/unloading opening 142 of the load lock chamber 141 whose pressure is previously set equal to the atmospheric pressure is opened by the operation of the gate valve 143, the wafers 200 are picked up by tweezers 125c of the wafer loading device 125a through the wafer in/out opening, the wafers 200 are loaded into the load lock chamber 141 through the wafer loading/unloading opening 142, the wafers 200 are transferred to the boat 217, and the boat 217 is charged with wafers 200. The wafer loading device 125a which delivered the wafers 200 to the boat 217 returns to the cassette 110, and charges the boat 217 with the next wafers 200.

When the boat 217 is charged with a predetermined number of wafers 200, the wafer transfer in/out opening 142 is closed by the gate valve 143, and the load lock chamber 141 is evacuated. If the pressure in the load lock chamber 141 is reduced to the same level as that in the processing furnace 202, a lower end of the processing furnace 202 is opened by the furnace opening gate valve 147. Then, the seal cap 219 is moved upward by the boat elevator 115, and the boat 217 supported by the seal cap 219 is loaded into the processing furnace 202.

After the loading, the processing furnace 202 subjects the wafers 200 to arbitrary processing (the above-described forming processing of Si oxide film). After the processing, the boat 217 is pulled out by the boat elevator 115, the pressure in the load lock chamber is returned to the atmospheric pressure and then, the gate valve 143 is opened. Thereafter, the cassette 110 and the wafers 200 are unloaded outside the casing 111 by reversing the above-described procedure.

Embodiment 2

Next, a modification of the semiconductor device according to the preferred embodiments of the present invention will be explained with reference to FIG. 11.

Figure 11:
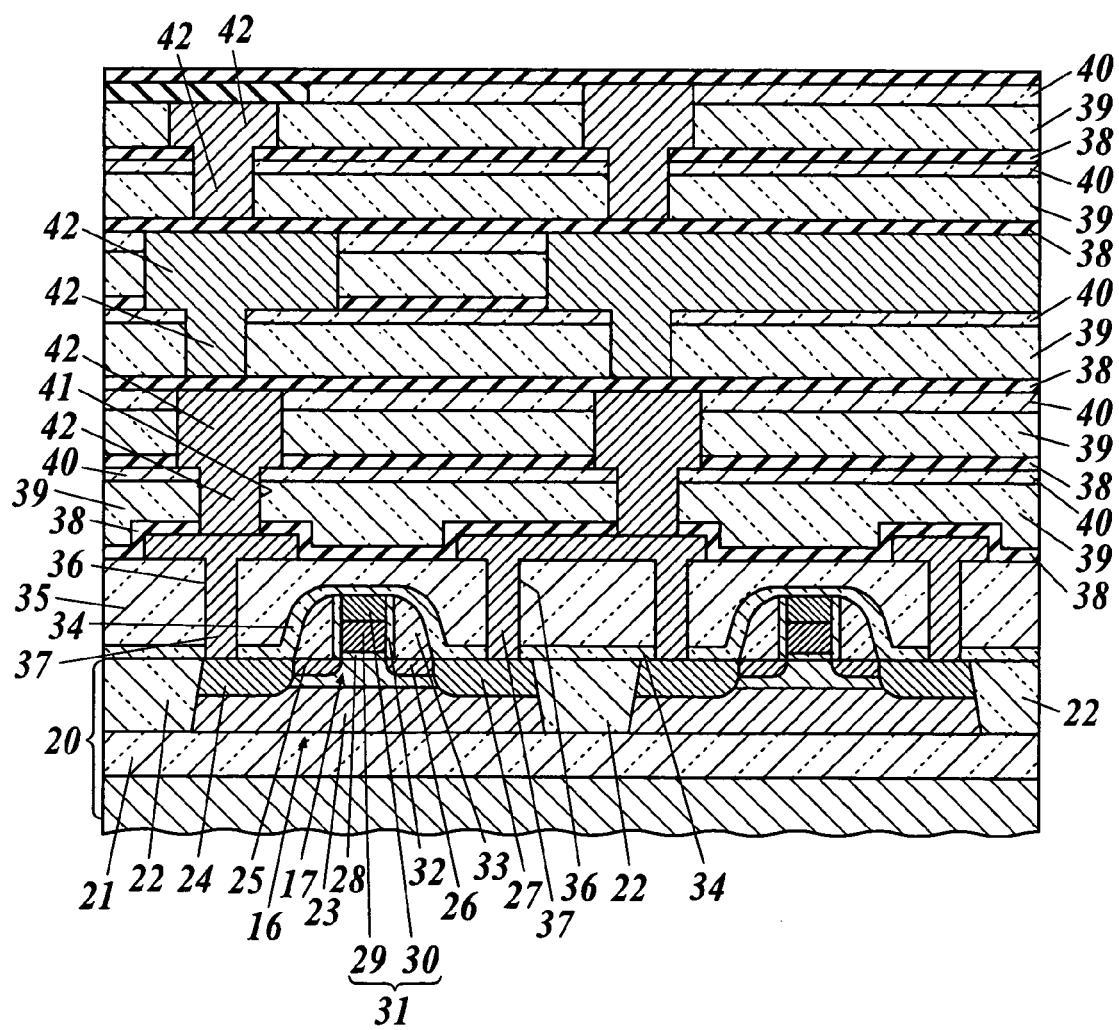
FIG. 11 is a diagram showing a modification of the semiconductor device shown in FIG. 1.

FIG. 11 is a diagram showing a modification of the semiconductor device shown in FIG. 1.

The semiconductor device 15 shown in FIG. 11 has substantially the same structure as the semiconductor device 15 shown in FIG. 1. A gate electrode 31 of the semiconductor device 15 in FIG. 11 includes a poly-Si layer 29 which is lower layer and a W film 30 which is an upper layer. In such a semiconductor device 15 also, a SiO film 32 and a SiN film 33 are sequentially formed after the W film 30 is formed, but if the W film 30 is oxidized when the SiO film 32 is formed, there arises a problem that a shape of the W film 30 is varied due to volume expansion caused by the oxidation of W. Therefore, when supplying an oxidizing material, the SiO film 32 is formed on the W film 30 by the ALD method while supplying $H_2$ and preventing the W film from being oxidized.

As explained above, according to the preferred embodiments of the present invention, there is provided a producing method of a semiconductor device, comprising: loading at least one substrate formed on a surface thereof with a tungsten film into a processing chamber; and forming a silicon oxide film on the surface of the substrate which includes the tungsten film by alternately repeating following steps a plurality of times: supplying the processing chamber with a first reaction material including a silicon atom while heating the substrate at 400° C.; and supplying the processing chamber with hydrogen and water which is a second reaction material while heating the substrate at 400° C. at a ratio of the water with respect to the hydrogen of $2 \times 10^{-1}$ or lower.

According to the preferred embodiments of the present invention, since water and hydrogen are supplied into the processing chamber at a specific ratio, even if the tungsten film is oxidized, its oxide is reduced, and a first reaction material is oxidized even at a low temperature as low as 400° C. or less. Therefore, it is possible to form a silicon oxide film on the tungsten film at a low temperature as low as 400° C. or less while preventing the tungsten film from being oxidized.

According to the another preferred embodiments of the present invention, there is provided a producing method of a semiconductor device, comprising at least: loading at least one substrate formed on a surface thereof with a metal film into a processing chamber; and forming an oxide film including silicon on the surface of the substrate which includes the metal film, wherein the forming the oxide film includes: supplying a first reaction material including a silicon atom into the processing chamber while heating the substrate at a predetermined temperature; and supplying hydrogen and a second reaction material including an oxygen atom into the processing chamber while heating the substrate at the predetermined temperature.

According to the another preferred embodiments of the present invention, since hydrogen and a second reaction material including an oxygen atom are supplied into the processing chamber, even if the metal film is oxidized, its oxide is reduced, and the first reaction material is oxidized even at a low temperature. Thus, it is possible to form an oxide film on the metal film at a low temperature while preventing the metal film from being oxidized.

Preferably, there is provided a producing method of a semiconductor device in which in the forming the oxide film, supply of the first reaction material and supply of the second reaction material and the hydrogen are alternately repeated a plurality of times to form the oxide film. An ALD method is used as one example of this producing method.

Preferably, there is provided a producing method of a semiconductor device in which the metal film is a tungsten film, the predetermined temperature is in a range of 100 to 450° C., the second reaction material is water, and when the predetermined temperature and a supply ratio of the water with respect to the hydrogen is defined as $(T, H_2O/H_2)$, the supply ratio of the water with respect to the hydrogen is equal to or less than straight lines connecting points of $(T, H_2O/H_2)$= $(100°$ C., $8 \times 10^{-4})$, $(200°$ C., $2 \times 10^{-2})$, $(300°$ C., $9 \times 10^{-2})$, $(400°$ C., $2 \times 10^{-1})$, $(450°$ C., $2.5 \times 10^{-1})$.

Preferably, there is provided a producing method of a semiconductor device in which the metal film is a tungsten film, the predetermined temperature is in a range of 100 to 450° C., the second reaction material is ozone, and when the predetermined temperature and a supply ratio of the ozone with respect to the hydrogen is defined as $(T, O_3/H_2)$, the supply ratio of the ozone with respect to the hydrogen is equal to or less than straight lines connecting points of $(T, O_3/H_2)$=$(100°$ C., $8 \times 10^{-4})$, $(200°$ C., $2 \times 10^{-2})$, $(300°$ C., $9 \times 10^{-2})$, $(400°$ C., $2 \times 10^{-1})$, $(450°$ C., $2.5 \times 10^{-1})$.

Preferably, there is provided a producing method of a semiconductor device in which in the forming the oxide film, after a thickness of the oxide film reaches a desired thickness, the oxide film is formed without supplying the hydrogen in a supply step of the second reaction material and the hydrogen.

Preferably, the desired thickness is $X_0$ defined by the following equation:

$$X_0 = B/A \times t,$$

in which $[B/A] = Ce^{-E_2/kT}$, $[C] = 18.35$ Å/second, $[E_2] = 7.5 \times 10^{-2}$ eV, $[k]$ is a Boltzmann constant and $k = 8.62 \times 10^{-5}$ eVK$^{-1}$, and $[t]$ is supply time of the second reaction material.

Preferably, there is provided a producing method of a semiconductor device in which the predetermined temperature is 300° C., the second reaction material is ozone, in the forming the oxide film, the hydrogen is supplied into the processing chamber in the supply step of the second reaction material and the hydrogen until a thickness of the oxide film reaches 20 Å, and after the thickness of the oxide film reaches 20 Å, the oxide film is formed without supplying the hydrogen into the processing chamber in the supply step of the second reaction material and the hydrogen.

Preferably, there is provided a producing method of a semiconductor device in which in the forming the oxide film, the first reaction material, the second reaction material and the hydrogen are supplied at the same time to form the oxide film so that the first reaction material, the second reaction material and the hydrogen exist in the processing chamber at the same time. A CVD method is used as one example of this producing method.

More preferably, there is provided a producing method of a semiconductor device in which the first reaction material including a silicon atom is an organic compound of silicon such as TDMAS (Tris dimethyl amino silane).

More preferably, there is provided a producing method of a semiconductor device in which the second reaction material is an oxidizing material such as water, ozone and oxygen.

More preferably, there is provided a producing method of a semiconductor device in which when the second reaction material and hydrogen are supplied, a catalyst such as pyridine is added to form the oxide film.

More preferably, there is provided a producing method of a semiconductor device in which when the second reaction material and hydrogen are supplied, plasma excitation is used to excite oxygen as one example of the oxidizing material.

More preferably, there is provided a producing method of a semiconductor device in which an inside of the processing chamber is purged by an inert gas after the supply step of the first reaction material or the supply step of the second reaction material and hydrogen, and helium (He), neon (Ne), argon (Ar) or nitrogen ($N_2$) is used as one example of the inert gas.

More preferably, there is provided a producing method of a semiconductor device in which a temperature in the processing chamber is in a range of 0 to 700° C.

More preferably, there is provided a producing method of a semiconductor device in which a pressure in the processing chamber in the forming step of the oxide film is in a range of 1 to 10000 Pa.

The entire disclosures of Japanese Patent Application No. 2006-008611 filed on Jan. 17, 2006 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, it is possible to form an oxide film on a metal film at a low temperature while preventing the metal film from being oxidized. As a result, the present invention can especially suitably be utilized for a producing method of a semiconductor device for forming an oxide film on a substrate formed with a metal film which is a foundation while preventing the metal film from being oxidized.

The invention claimed is:

1. A producing method of a semiconductor device, comprising:

loading at least one substrate formed on a surface thereof with a tungsten film into a processing chamber; and forming a silicon oxide film on the surface of the substrate which includes the tungsten film by alternately repeating following steps a plurality of times: supplying the processing chamber with a first reaction material including a silicon atom while heating the substrate at 400° C.; and supplying the processing chamber with hydrogen and water which is a second reaction material while heating the substrate at 400° C. at a ratio of the water with respect to the hydrogen of $2\times10^{-1}$ or lower, wherein in the forming the silicon oxide film, after a thickness of the silicon oxide film reaches a desired thickness, the silicon oxide film is formed without supplying the processing chamber with hydrogen and water as the second reaction material.

2. A producing method of a semiconductor device, comprising at least:

loading at least one substrate formed on a surface thereof with a metal film into a processing chamber; and forming an oxide film including silicon on the surface of the substrate which includes the metal film, wherein the forming the oxide film includes:

supplying a first reaction material including a silicon atom into the processing chamber while heating the substrate at a predetermined temperature; and supplying hydrogen and a second reaction material including an oxygen atom into the processing chamber while heating the substrate at the predetermined temperature, wherein in the forming the oxide film, supply of the first reaction material and supply of the second reaction material and the hydrogen are alternately repeated a plurality of times to form the oxide film, and wherein in the forming the oxide film, after a thickness of the oxide film reaches a desired thickness, the oxide film is formed without supplying the hydrogen in a supply step of the second reaction material and the hydrogen.

3. The producing method of a semiconductor device according to claim 2, wherein the metal film is a tungsten film, the predetermined temperature is in a range of 100 to 450° C., the second reaction material is water, and when the predetermined temperature and a supply ratio of the water with respect to the hydrogen is defined as (T, $H_2O/H_2$), the supply ratio of the water with respect to the hydrogen is equal to or less than straight lines connecting points of (T, $H_2O/H_2$)=(100° C., $8\times10^{-4}$), (200° C., $2\times10^{-2}$), (300° C., $9\times10^{-2}$), (400° C., $2\times10^{-1}$), (450° C., $2.5\times10^{-1}$).

4. The producing method of a semiconductor device according to claim 2, wherein the metal film is a tungsten film, the predetermined temperature is in a range of 100 to 450° C., the second reaction material is ozone, and when the predetermined temperature and a supply ratio of the ozone with respect to the hydrogen is defined as (T, $O_3/H_2$), the supply ratio of the ozone with respect to the hydrogen is equal to or less than straight lines connecting points of (T, $O_3/H_2$)=(100° C., $8\times10^{-4}$), (200° C., $2\times10^{-2}$), (300° C., $9\times10^{-2}$), (400° C., $2-10^{-4}$), (450° C., $2.5\times10^{-1}$).

5. The producing method of a semiconductor device according to claim 2, wherein the desired thickness is $X_0$ defined by the following equation:

$$X_0 = B/A \times t,$$

in which $[B/A] = Ce^{-E2/kT}$, $[C] = 18.35$ Å/second, $[E_2] = 7.5 \times 10^{-2}$ eV, [k] is a Boltzmann constant and $k = 8.62 \times 10^{-5}$ eVK$^{-1}$, and [t] is supply time of the second reaction material.

6. The producing method of a semiconductor device according to claim 2, wherein the predetermined temperature is 300° C., the second reaction material is ozone, in the forming the oxide film, the hydrogen is supplied into the processing chamber in the supply step of the second reaction material and the hydrogen until a thickness of the oxide film reaches 20 Å, and after the thickness of the oxide film reaches 20 Å, the oxide film is formed without supplying the hydrogen into the processing chamber in the supply step of the second reaction material and the hydrogen.

7. The producing method of claim 2, wherein the steps of forming the oxide film are in accordance with an Atomic Layer Deposition method.

8. A producing method of a semiconductor device, comprising at least:

loading at least one substrate formed on a surface thereof with a metal film into a processing chamber; and forming an oxide film including silicon on the surface of the substrate which includes the metal film, wherein the forming the oxide film includes:

supplying a first reaction material including a silicon atom into the processing chamber while heating the substrate at a predetermined temperature; and supplying hydrogen and a second reaction material including an oxygen atom into the processing chamber while heating the substrate at the predetermined temperature, wherein in the forming the oxide film, the first reaction material, the second reaction material and the hydrogen are supplied at the same time to form the oxide film so that the first reaction material, the second reaction material and the hydrogen exist in the processing chamber at the same time.

9. The producing method of claim 8, wherein the first reaction material including the silicon atom is an organic compound of silicon such as TDMAS (Tris dimethyl amino silane).

10. The producing method of claim 8, wherein the second reaction material is an oxidizing material such as water, ozone and oxygen.

11. The producing method of claim 8, wherein when the second reaction material and the hydrogen are supplied, a catalyst such as pyridine is added to form the oxide film.

12. The producing method of claim 10, wherein when the second reaction material and the hydrogen are supplied, plasma excitation is used to excite oxygen as one example of the oxidizing material.

13. The producing method of claim 8, wherein an inside of the processing chamber is purged by an inert gas after supplying the first reaction material or supplying the second reaction material and the hydrogen, and helium (He), neon (Ne), argon (Ar) or nitrogen ($N_2$) is used as one example of the inert gas.

14. The producing method of claim 8, wherein a temperature in the processing chamber is in a range of 0 to 700° C.

15. The producing method of claim 8, wherein a pressure in the processing chamber in the forming the oxide film is in a range of 1 to 10000 Pa.

* * * * *